US012645147B2

(12) United States Patent　　(10) Patent No.:　US 12,645,147 B2
Bos et al.　　　　　　　　　　(45) Date of Patent:　　Jun. 2, 2026

---

(54) TEMPERATURE MEASUREMENT OF OPTICAL ELEMENTS IN AN OPTICAL APPARATUS

(71) Applicant: ASML Netherlands B.V., Veldhoven (NL)

(72) Inventors: Koen Martin Willem Jan Bos, Eindhoven (NL); Joost André Klugkist, Waalre (NL); Anirudh Anand, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 241 days.

(21) Appl. No.: 18/286,631

(22) PCT Filed: Mar. 29, 2022

(86) PCT No.: PCT/EP2022/058246
§ 371 (c)(1),
(2) Date: Oct. 12, 2023

(87) PCT Pub. No.: WO2022/233500
PCT Pub. Date: Nov. 10, 2022

(65) Prior Publication Data
US 2024/0201029 A1　　Jun. 20, 2024
US 2025/0085172 A9　　Mar. 13, 2025

(30) Foreign Application Priority Data

May 3, 2021　(EP) ..................................... 21171796

(51) Int. Cl.
*G03F 7/00*　　　　(2006.01)
(52) U.S. Cl.
CPC ........ *G03F 7/7015* (2013.01); *G03F 7/70316* (2013.01); *G03F 7/70525* (2013.01);
(Continued)

(58) Field of Classification Search
CPC .............. G03F 7/7015; G03F 7/70316; G03F 7/70525; G03F 7/7085; G03F 7/70891;
(Continued)

(56) References Cited

U.S. PATENT DOCUMENTS

| | | | |
|---|---|---|---|
| 11,320,314 B2 | 5/2022 | Gruner et al. | |
| 2003/0169520 A1* | 9/2003 | Goldstein | .............. G02B 26/06 |
| | | | 359/845 |

(Continued)

FOREIGN PATENT DOCUMENTS

| | | |
|---|---|---|
| DE | 102018212400 A1 | 1/2020 |
| TW | 201921161 A | 6/2019 |

OTHER PUBLICATIONS

International Search Report and Written Opinion of the International Searching Authority directed to International Patent Application No. PCT/EP2022/058246, mailed Jun. 30, 2022; 11 pages.

(Continued)

*Primary Examiner* — Mariam Qureshi
(74) *Attorney, Agent, or Firm* — FINNEGAN, HENDERSON, FARABOW, GARRETT & DUNNER, LLP

(57) ABSTRACT

An optical apparatus is disclosed, the apparatus comprising an optical element having a reflective surface for reflecting incident radiation in a beam path, and at least one sensor configured to sense radiation corresponding to a temperature of a respective portion of a backside surface of the optical element. Also disclosed is a method of controlling a temperature of a reflective surface of an optical element in a lithographic apparatus.

17 Claims, 7 Drawing Sheets

(52) U.S. Cl.
CPC ........ *G03F 7/7085* (2013.01); *G03F 7/70891*
(2013.01); *G03F 7/70958* (2013.01)

(58) Field of Classification Search
CPC ... G03F 7/70958; G01J 5/0003; G01J 5/0816;
G01J 5/48; G01J 5/0007; G02B 7/181
See application file for complete search history.

(56)                    References Cited

U.S. PATENT DOCUMENTS

2004/0155154 A1* 8/2004 Topping ................ G01K 11/14
                                            374/E11.02
2007/0127005 A1* 6/2007 Visser ................ G03F 7/70075
                                            355/71
2012/0044468 A1   2/2012 Streefkerk et al.
2013/0176544 A1* 7/2013 Hauf ..................... G02B 7/181
                                            355/30
2019/0129299 A1   5/2019 Nasalevich et al.

OTHER PUBLICATIONS

Soltani et al., "Intelligent Coatings for Corrosion Control—Chapter 13: Properties and Applications of Thermochromic Vanadium Dioxide Smart Coatings," Dec. 2015; pp. 461-490.

Yoon et al., "Improvements in the design of thermal-infrared radiation thermometers and sensors," Optics Express, vol. 27, No. 10, May 13, 2019; pp. 14246-14259.

Sun et al., "Curing shrinkage stress and deformation analysis of adhesive bonding large aperture mirror," Proc. of SPIE, vol. 10837, 9th International Symposium on Advanced Optical Manufacturing and Testing Technologies: Large Mirrors and Telescopes, Jan. 11, 2019; 11 pages.

Taiwanese Office Action directed to Taiwanese Patent Application No. 111114943, mailed Oct. 15, 2025; 14 pages.

* cited by examiner

505
Configure at least one sensor to sense radiation corresponding to a temperature of a portion of a backside surface of the optical element

510
Use a signal provided by the sensor to configure a temperature controller to control a temperature of the optical element

TEMPERATURE MEASUREMENT OF OPTICAL ELEMENTS IN AN OPTICAL APPARATUS

CROSS-REFERENCE TO RELATED APPLICATIONS

This application claims priority of EP Application Serial No. 21171796.2 which was filed on 3 May 2021 and which is incorporated herein in its entirety by reference.

FIELD

The present invention relates to minimizing surface figure deformations of optical elements within an optical apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In an example of the above-described lithographic apparatus, EUV radiation from an EUV radiation source may be collected and directed as a beam of radiation towards the patterning device and subsequently towards the substrate. One or more optical elements having a surface reflective to EUV radiation, e.g. mirrors, may be implemented in the lithographic apparatus, such as to collect and/or direct the beam of radiation.

In use, such optical elements may require thermal conditioning to prevent or minimize optical aberrations induced by thermal deformations of the reflective surfaces of the optical elements. That is, to reduce a dependency of a temperature of such optical elements upon an incident EUV radiation dosage, certain optical elements may be configured to exhibit a minimal deformation at a defined elevated temperature above an ambient temperature. A so-called "mirror preheating system" (MPHS) using infrared light may be used to heat the optical elements to the elevated temperature by irradiating the optical elements with infrared radiation. In use, an intensity or dosage of the infrared radiation emitted from the MPHS may be reduced during an EUV radiation exposure process to balance an EUV radiation induced heat load, thereby maintaining the temperature of the optical elements substantially at or close to the aforementioned elevated temperature.

To measure and thereby control a temperature of the optical elements, temperature sensors may be mounted below the reflective surface of the optical element. However, such sensors may induce surface figure deformations (SFD) due, at least in part, to an installation process and/or an ageing process relating to adhesive utilized to install the sensors.

It is desirable to be able to provide a means to control a temperature of the optical elements without inducing such surface figure deformations that may affect an accuracy of an EUV radiation exposure process.

It is therefore an object of at least one embodiment of at least one aspect of the present disclosure to obviate or at least mitigate at least one of the above identified shortcomings of the prior art.

SUMMARY

According to a first aspect of the disclosure, there is provided an optical apparatus comprising: an optical element having a reflective surface for reflecting incident radiation in a beam path; and at least one sensor configured to sense radiation corresponding to a temperature of a respective portion of a backside surface of the optical element.

Advantageously, the at least one sensor is configured to sense radiation, rather than conducted heat as is the case in prior art optical apparatus, as described in more detail below. That is, the at least one sensor is provided in a contactless arrangement with the optical element wherein the at least one sensor, or at least a radiation-sensitive portion of the at least one sensor, is not in physical contact with the respective portion of the backside surface of the optical element. Advantageously, by using such a contactless arrangement, there is no need to adhere the at least one sensor to the backside surface of the optical element, and therefore no SFD effects are induced by thermomechanical stresses or stresses caused by aging of an adhesive.

Furthermore, advantageously by using such a contactless arrangement, the optical apparatus may be less likely to be damaged and/or require maintenance, and hence the optical apparatus may have an increased lifetime.

A gap may be provided between the at least one sensor and the respective portion of the backside surface of the optical element.

The portion of the backside surface may be in a cavity formed in a backside of the optical element.

Furthermore, because of the contactless arrangement, such cavities can be formed to extend much closer to the reflective surface of the optical element without incurring an increase in SFD effects than in existing solutions, such as those described below with reference to FIGS. 3 and 4, wherein sensors are adhered to a backside surface of the optical element.

Furthermore, since such a contactless arrangement may lead to a reduction in SFD effects, a greater quantity of cavities and associated sensors may be implemented, thereby enabling a more complete, precise and responsive determination and control of a temperature of the reflective surface of the optical element by a MPHS.

The optical apparatus may comprise at least one through-passage connecting a void defined by the gap to an area outside the cavity.

The cavity may be formed such that the portion of the backside surface is less than 5 millimeters from the reflective surface.

The at least one sensor may comprise a pyrometer configured to sense infrared radiation radiated from the respective portion of the backside surface of the optical element.

The optical apparatus may comprise a high-emissivity coating formed on the portion of the backside surface.

The optical apparatus may comprise at least one coating formed on the respective portion of the backside surface.

The at least one coating may be configured to have temperature-dependent optical properties.

The at least one coating may comprise a thermochromic coating.

The at least one coating may comprise a plurality of coatings configured as an interference filter and/or a grating having temperature-dependent optical properties. The grating may be a volume Bragg grating.

The optical apparatus may comprise at least one radiation-emitting device configured to emit radiation toward the at least one coating.

The at least one sensor may be configured to sense radiation emitted by the radiation-emitting device and reflected from the at least one coating and/or from the backside surface of the optical element.

The optical apparatus may comprise a temperature controller configured to use a signal from the at least one sensor to control a temperature of the optical element.

The optical apparatus may comprise a plurality of sensors, wherein the backside surface of the optical element may comprise a plurality of cavities, and each cavity may have an associated sensor configured to sense radiation corresponding to a temperature of a portion of the backside surface of the optical element within the cavity.

According to a second aspect of the disclosure, there is provided an optical system comprising at least one optical apparatus according to the first aspect.

The optical system may be configured as a projection system for a lithographic apparatus.

The optical system may be configured as an illumination system for a lithographic apparatus.

According to a third aspect of the disclosure, there is provided a lithographic apparatus comprising the optical system according to the second aspect.

According to a fourth aspect of the disclosure, there is provided a method of controlling a temperature of a reflective surface of an optical element in a lithographic apparatus, the method comprising: configuring at least one sensor to sense radiation corresponding to a temperature of a portion of a backside surface of the optical element; and using a signal provided by the sensor to configure a temperature controller to control a temperature of the optical element.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which.

DETAILED DESCRIPTION

Figure 1:
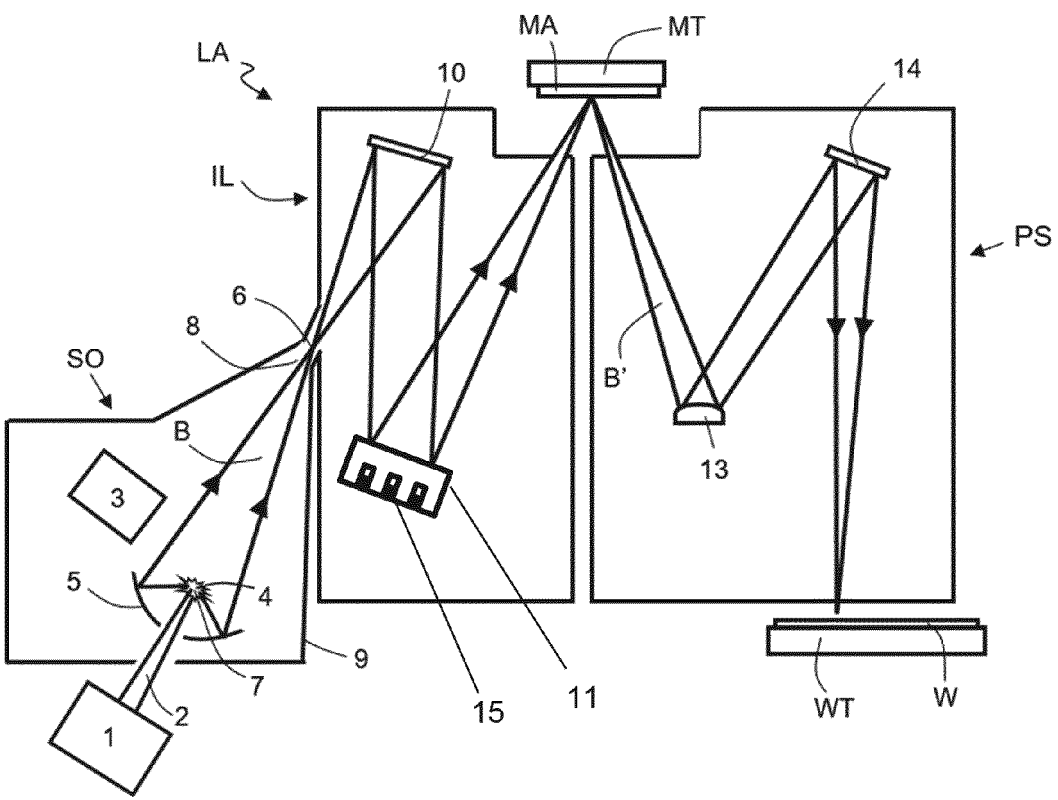
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure, which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

For purposes of example, and in accordance with an embodiment of the disclosure, the pupil mirror 11 which has a reflective surface for reflecting EUV radiation beam B is depicted as having a plurality of sensors 15 configured to sense radiation corresponding to a temperature of a respective portion of a backside surface of the pupil mirror 11. As such, the pupil mirror 11 and the plurality of sensors 15 are provided as an example of an optical apparatus, according to the appended claims.

It will be appreciated that the disclosure is embodied with sensors coupled to the pupil mirror 11 for purposes of example only, and in other examples falling within the scope of the disclosure such sensors may additionally or alternatively be implemented on one or more other optical elements within the lithographic system. For example, any or all of the plurality of mirrors 13,14, the patterning device MA, the collector 5 of the radiation source SO, the facetted field mirror device 10 and/or the facetted pupil mirror device 11, may be implemented with such sensors, as described in more detail below.

The disclosure is further described with reference to FIGS. 2 to 10. In particular, technical problems addressed by the disclosure are described in more detail below with reference to FIGS. 2 to 5.

Figure 2:
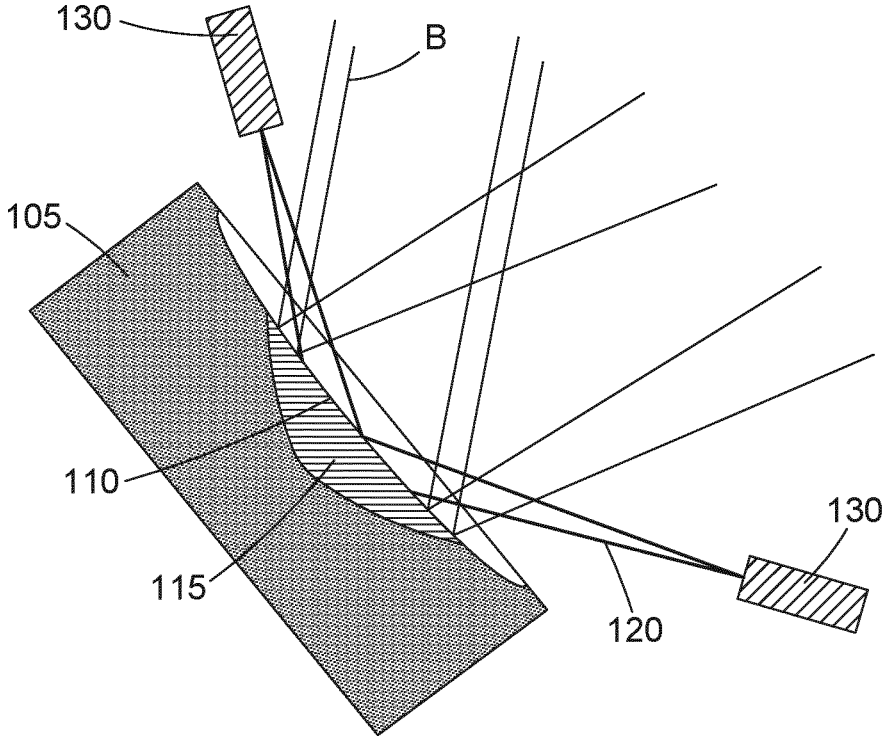
FIG. 2 depicts an example of use of a mirror preheating system.

FIG. 2 depicts an example of use of a mirror preheating system (MPHS). In the context of the lithographic system described herein, the term "mirror" will be understood to refer to an optical element having a surface that is reflective to wavelengths of radiation that are used for a lithographic exposure process, e.g. EUV radiation.

One or more MPHSs may be implemented in the lithographic system of FIG. 1. For example, before and/or during an exposure process, optical elements of the lithographic system such as any or all of the plurality of mirrors 13,14, the patterning device MA, the collector 5 of the radiation source SO, the facetted field mirror device 10 and/or the facetted pupil mirror device 11, may require thermal conditioning to prevent aberrations caused by thermal deformations. This may be particularly important in lithographic systems such as that of FIG. 1, wherein the EUV radiation beam B or the patterned EUV radiation beam B' may induce a substantial heating of any non-ideal reflective surfaces.

To reduce a dependency of the temperature of such optical elements upon of EUV beam intensity and/or dosage, certain optical elements may be configured to exhibit a minimal deformation at a temperature, denoted $T_{ZCR}$, above an ambient temperature. This temperature $T_{ZCR}$ may also be referred to as zero crossing temperature.

For purposes of example in FIG. 2, the optical element 105 is a mirror, which may for example be a mirror in the projection system PS, in the illumination system IL, or in the radiation source SO of the lithographic system of FIG. 1.

The EUV radiation beam B is directed at, and reflected from, a reflective surface 110 of the optical element 105. The EUV radiation beam B may induce a heating of the optical element 105, wherein such heating may be predominantly in a region 115 adjacent the reflective surface 110.

In order to balance such heating induced by the EUV radiation beam B, and thereby maintain a temperature of the optical element at or close to the nominal temperature $T_{ZCR}$, a mirror preheating system comprising one or more infrared radiation sources 130 may be configured to direct one or more infrared radiation beams 120 at the reflective surface 110 of the optical element 105.

The reflective surface 110 of the optical element 105 may absorb at least a portion of the infrared radiation beams 120, thereby heating the optical element 105 to an elevated temperature substantially at or close to the nominal temperature $T_{ZCR}$.

In use, during an exposure process when an EUV radiation beam B is incident and at least partly reflected from the optical element 105, a power of the infrared radiation beam 120 can be reduced to balance the induced heat of the EUV radiation beam B, and thereby maintain the temperature of the region 115 of the optical element 105 at or close to the nominal temperature $T_{ZCR}$.

The MPHS may comprise a closed loop controller configured to control a power of the infrared radiation beams 120 in response to, at least, a measured temperature of the optical element 105.

To sense the temperature, the optical element 105 may be provided with one or more temperature sensors. Such temperature sensors may be mounted in holes or cavities a defined distance below the reflective surface 110 of the optical element 105, as is explained in more detail with reference to FIGS. 3 and 4.

Figure 3:
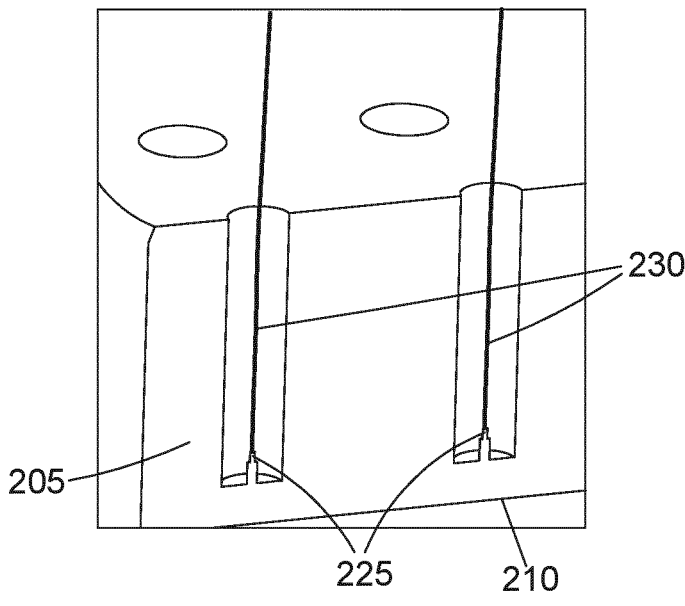
FIG. 3 depicts temperature sensors configured to sense a temperature of an optical element in a lithographic system.

FIG. 3 depicts temperature sensors 225 configured to sense a temperature of an optical element 205 in a lithographic system.

The optical element 205 comprises a reflective surface 210 for reflecting incident radiation in a beam path. The temperature sensors 225 are disposed in cavities 230 in a backside of the optical element 205. The temperature sensors 225 are adhered to a portion of a backside surface of the optical element 205. As such, temperature sensors 225 are configured to sense a temperature of the backside surface of the optical element 205.

Figure 4:
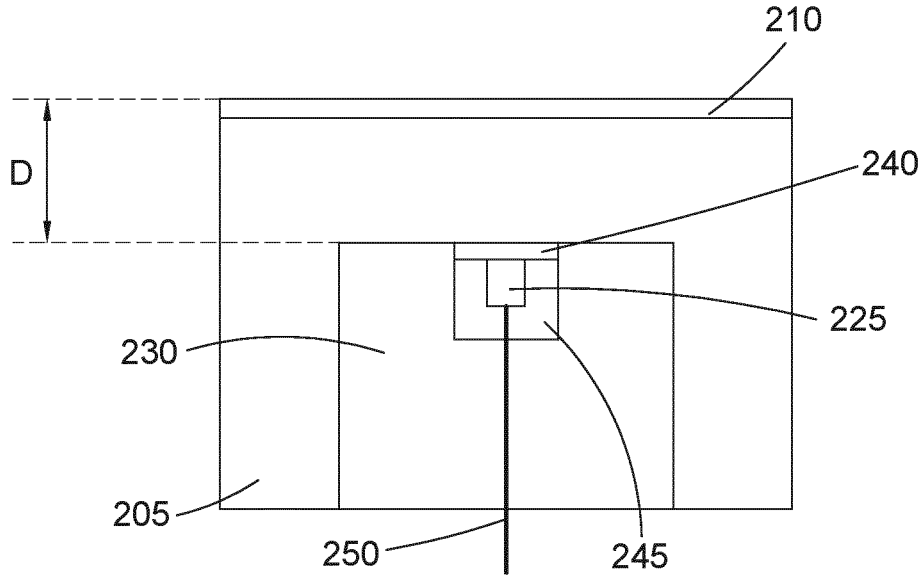
FIG. 4 depicts a cross-sectional view of a portion of the lithographic system of FIG. 3, showing in detail a temperature sensor configured to sense the temperature of the optical element.

The temperature sensors 225 are adhered to the portion of a backside surface of the optical element 205, as described in more detail with reference to FIG. 4. FIG. 4 depicts a cross-sectional view of a portion of the lithographic system of FIG. 3, showing in more detail a temperature sensor 225 configured to sense the temperature of the optical element 205.

The backside of the optical element 205 has a cavity 230. In the example of FIG. 4, wherein a surface of the cavity corresponds to a portion of a backside surface of the optical element 205.

The temperature sensor 225 is adhered to the surface of the cavity using an adhesive layer 240, e.g. a glue. In some examples, a protective mold or preformed layer 245 may be provided around the temperature sensor 225. A conductive element 250, e.g. a wire, extends from the temperature sensor 225 to further circuitry, such as components of the MPHS. Such an arrangement of a sensor 225 mounted on the optical element 205, or indeed any active element mounted on or introduced into the optical element 205, may disadvantageously result in an increased likelihood of damage or maintenance, and hence a reduced lifetime of such an arrangement. For example, the sensor 225 may break or become damaged in use, wherein maintenance or replacement of the damaged or broken sensor 225 may be difficult and/or not practically feasible without further affecting or even damaging the optical element 205.

The temperature sensor 225 is located a distance D below the reflective surface 210. Ideally the distance D should be minimized to maximize a response and sensitivity of the temperature sensor 225 to the temperature at or immediately adjacent the reflective surface 210 of the optical element 205. However, because of surface figure deformations (SFD) that may be induced due to the drilling of one or more holes to form the cavities 230, the distance D may be unduly large. An unduly large distance D may affect a responsiveness of the MPHS to temperature variation at the reflective surface 210, as described in more detail below with reference to FIG. 10.

Furthermore, deformations may be introduced into the optical element 210 by stresses induced by the adhesive layer 240. Specifically, as the adhesive layer 240 ages, the adhesive layer 240 may shrink and/or deform, changing stress levels at the reflective surface of the optical elements and thereby incurring SFD drift.

As such, it is desirable to implement a means to sense the temperature at or close to the reflective surface of the optical element without incurring significant SFD.

Furthermore, the distance or depth D may introduce a delay in temperature measurements of the optical surface, because of a thermal mass of the optical element 205 between the reflective surface 210 and the temperature sensor 225.

In an example arrangement corresponding to FIG. 2 described above, wherein the optical element 205 is formed from an ultra-low expansion (ULE) glass exhibiting a thermal diffusivity "$\alpha$" in the region of 0.7e-6 m$^2$/s and the temperature is sensed at a depth of approximately 0.015 meters, a time-constant of about 80 seconds may be defined by $$\tau = \frac{z^2}{4\alpha} \approx 80$$

seconds, wherein 'z' corresponds to the depth and '$\tau$' is the time-constant.

This time-constant corresponds to a delay known to introduce 'first-wafer' effects. That is, a typical exposure time for a substrate may be in the region of 20 to 30 seconds, which is substantially lower than the above-described time-constant of 80 seconds. As such, a response time of the MPHS may be insufficient to compensate the temperature of the optical element 205 for a first exposed wafer, and in some cases one or more subsequent wafers.

Figure 5:
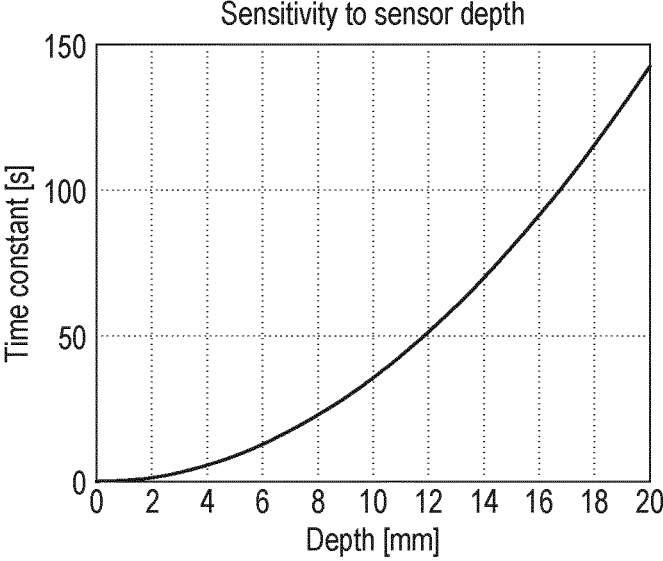
FIG. 5 is a graph depicting a relationship between a depth of the sensor within the optical element and a time constant.

A sensitivity of the time constant '$\tau$' to the depth the temperature sensors 225 from the reflective surface of the optical element 205 in a typical configuration is illustrated by the graph of FIG. 5. For example, it can be seen that at a depth of approximately 5 millimeters from the reflective surface, a time constant would be in the region of 10 seconds, which is significantly shorter than a typical exposure time of 20 to 30 seconds. As such, a temperature sensor mounted at such a depth may strongly reduce such 'first-wafer' effects. However, in order to avoid the SFD effects described above that may be incurred by the ageing adhesive and/or formation of cavities, temperatures sensors in existing systems are typically mounted at a greater distance from the reflective surface. For example, a temperature sensor mounted at a depth of approximately 15 millimeters in existing systems may exhibit a time constant in the region of 80 seconds, much larger than a typical exposure time.

It is therefore desirable to sense the temperature as close as possible to the reflective surface of the optical element to minimize the time constant, yet not to incur substantial SFD effects due to installation of the sensor itself.

Figure 6A:
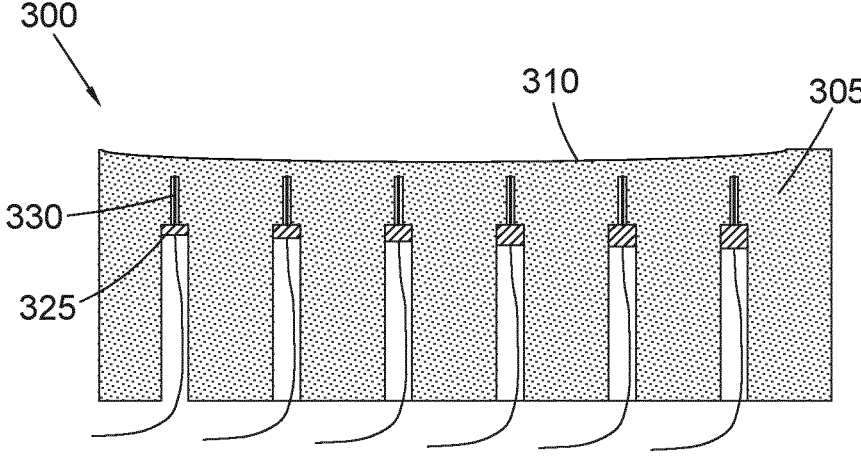
FIGS. 6a and 6b depict a cross-sectional view of an optical apparatus according to an embodiment of the disclosure.

FIG. 6a depicts a cross-sectional view of an optical apparatus 300 according to an embodiment of the disclosure.

The optical apparatus 300 comprises an optical element 305 having a reflective surface 310 for reflecting incident radiation in a beam path.

The example optical apparatus 300 also comprises a plurality of sensors 325 configured to sense radiation 330 corresponding to a temperature of a respective portion of a backside surface of the optical element 305. Although the example optical apparatus 300 depicts a plurality of sensors 325, it will be understood that in some embodiments as few as one sensor 325 may be implemented.

Advantageously, the sensors 325 are configured to sense radiation, rather than conducted heat as is the case in the above-described prior art temperature sensors 225.

That is, the sensors 325 are provided in a contactless arrangement with the optical element 305, wherein the sensors 325, or at least a radiation-sensitive portion of the sensors 325, are not in physical contact with the respective portion of the backside surface of the optical element 305.

Figure 6B:
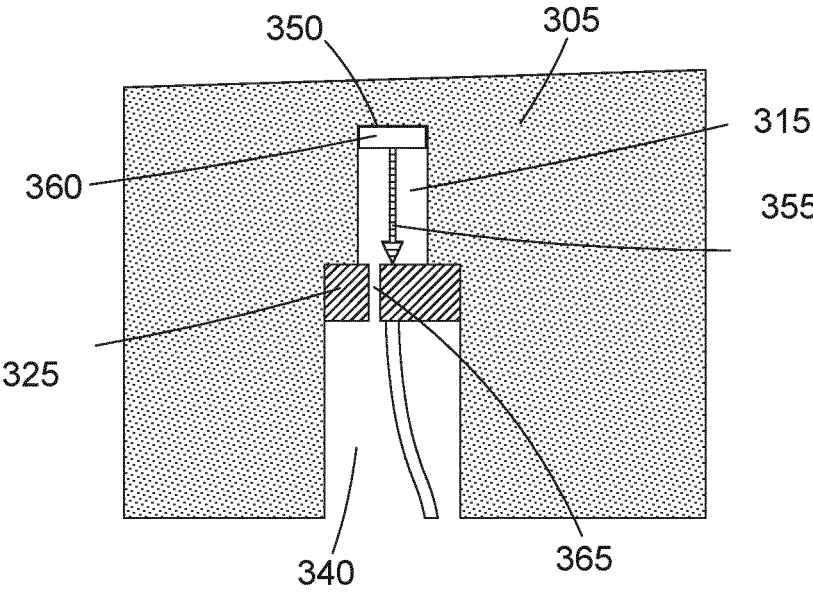

FIG. 6*b* provides an enlarged view of a portion of the optical apparatus 300, and more clearly depicts a gap 315 provided between each sensor 325 and the respective portion 350 of the backside surface of the optical element 305. The gaps ensures the sensors 325 are not in direct contact with the respective portion 350 of the backside surface of the optical element 305.

Advantageously, by using such a contactless arrangement, there is no need to adhere the sensor 325 to the backside surface 350 of the optical element 305 and therefore no SFD effects are induced by aging adhesive, as described above. That is, as depicted in FIG. 6*b*, the sensors 325 are disposed relatively close to, but not in contact with, the backside surface 350 of the optical element 305.

As depicted in FIG. 6*b*, the portion of the backside surface is in a cavity 340 formed in a backside of the optical element 305. The cavity 340 may be formed by drilling the backside of the optical element 305.

Because of the above-described contactless arrangement, such cavities 340 can be formed to extend much closer to the reflective surface 310 of the optical element 305 without incurring an increase in SFD effects than in existing solutions such as those depicted in FIGS. 3 and 4, wherein sensors 225 are adhered to a backside surface of the optical element 205.

For example, existing solutions that use sensors adhered to the backside surface of the optical element may have such sensors disposed in the region of 15 millimeters or more away from the reflective surface of the optical element. By implementing the above-described contactless arrangement, the cavity 340 in which the sensor 325 is disposed may be formed such that the portion of the backside surface 350 is less than 10 millimeters from the reflective surface 310 of the optical element 305. In some embodiments, the portion of the backside surface 350, e.g. the surface of which the temperature is sensed, may be disposed less than 5 millimeters from the reflective surface 310.

In some embodiments, the cavities 340 may be of a similar size and depth to existing solutions, e.g. the cavities in FIGS. 3 and 4. In such embodiments, due to the above-described contactless arrangement and hence lack of adhesive and stresses applied directly to the optical element 305, SFD drift may be reduced compared to the existing solutions of FIGS. 3 and 4.

Furthermore, since such a contactless arrangement may lead to a reduction in SFD effects, a greater quantity of cavities 340 and associated sensors 325 may be implemented, thereby enabling a more complete, precise and responsive determination and control of a temperature of the reflective surface 310 of the optical element 305 by a MPHS.

In an example embodiment, the sensor 325 may be a pyrometer. Such a pyrometer may be configured to sense infrared radiation 355 radiated from the respective portion of the backside surface 350 of the optical element 305.

Advantageously, because pyrometers may have measurement-spot sizes as small as 0.1 millimeters, a pyrometer may be used with a cavity that is narrower than a cavity that would be required to physically mount a temperature sensor, as in the current solutions of FIGS. 3*a* and 3*b*. As such, the pyrometer may be mounted much further from the reflective surface 310 than in existing solutions, and therefore the effects of surface figure deformations may be greatly reduced compared to solutions wherein temperature sensors are physically adhered to the optical element relatively close to the reflective surface 310.

In some embodiments, a high-emissivity coating 360 may be formed on the portion of the backside surface 350. In some embodiments, the high-emissivity coating 360 may be additionally formed on a sidewalls of the cavity 340. For example, the high-emissivity coating 360 may be provided as a conformal coating applied to at least a portion of the cavity 340.

The high-emissivity coating 340 will be understood to be a coating comprising material that increases an emissivity of infrared radiation 355, such that the sensor 325 is exposed to a greater quantity of infrared radiation 355 emitted from the portion of the backside surface 350 of the optical element 305, than would be emitted without the high-emissivity coating 340.

In an example embodiment, the high-emissivity coating may comprise $MoSi_2$.

Advantageously, use of a high-emissivity coating 360 may improve an accuracy of temperature measurements.

Also depicted in FIG. 6*b* is a through-passage 365 connecting a void defined by the gap 315 to an area outside the cavity 340. The through-passage 365 may be formed as a channel. In some embodiments the through-passage 365 may be formed in the sensor 325. In some embodiments the through-passage 365 may be formed after installation of the sensors 325, such as by drilling or the like.

Advantageously, such a through-passage ensures that no pressure-differential exists between the void defined by the gap 315 and the area outside the cavity 340. In use, a portion of a lithographic system in which the disclosed optical apparatus is implemented may be operated under low-pressure or near-vacuum conditions. As such, it is essential that when the portion of a lithographic system is depressurized, a pressure differential is not induced between the void defined by the gap 315 and the area outside the cavity 340, wherein such a pressure differential may induce SFD effects on the reflective surface 310 of the optical element 305 or cause a virtual leak, e.g. an uncontrolled leak of gas from the void defined by the gap 315 into the area outside the cavity 340, via any relatively small, low conductance path that may be present such as an imperfect seal around the sensor 325.

Although FIGS. 6*a* and 6*b* depict a portion of the sensors 325 being physically coupled to the optical element 305, it will be appreciated that in other embodiments falling within the scope of the disclosure, the sensors 325 may be arranged such that they do not physically contact the optical element 305. For example, in some embodiments, the sensors 325 may be supported by a support structure, such as a frame. The support structure may be a frame for holding the optical element 305. In such embodiments, the optical element 305 may be provided without one or more cavities to provide a portion of a backside surface 350 of the optical element 305 for sensing a temperature of. That is, the backside surface of the optical element 305 where the temperature is sensed may, in some embodiments, be substantially planar.

Figure 7:
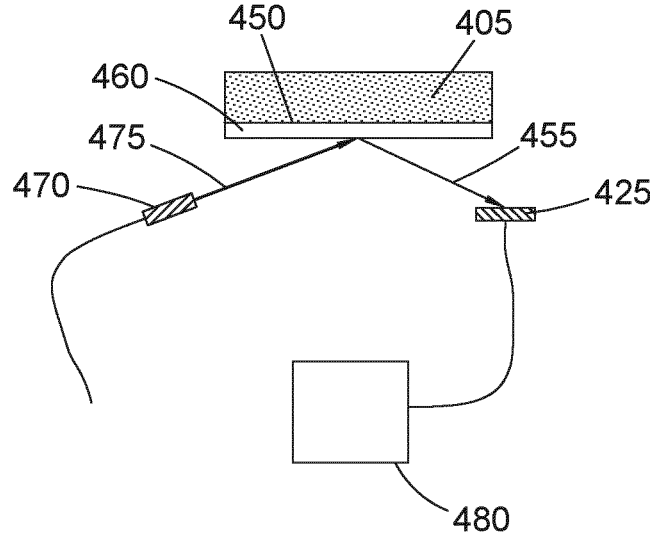
FIG. 7 depicts a sensor configured to sense radiation corresponding to a temperature of a portion of a backside surface of an optical element, according to a further embodiment of the disclosure.

FIG. 7 depicts a sensor 425 configured to sense radiation 455 corresponding to a temperature of a portion of a backside surface 450 of an optical element 405, according to a further embodiment of the disclosure.

In the example of FIG. 7, at least one coating 460 is formed on the portion of the backside surface 450, wherein the at least one coating 460 is configured to have temperature-dependent optical properties.

For example, in some embodiments, the at least one coating 460 comprises a thermochromic coating.

Also depicted in FIG. 7 is a radiation-emitting device 470 configured to emit radiation 475 toward the at least one coating 460. The radiation-emitting device 470 emits radiation 475 toward the at least one coating 460 with sufficiently low-intensity to avoid incurring additional substantial heating of the optical element 405.

It will be appreciated that, for purposes of clarity of illustration, a cavity is not depicted in FIG. 7. However, it will be understood that the embodiment described with respect to FIG. 7 may be implemented wherein the portion of a backside surface 450 of the optical element 405 is formed in a cavity, as exemplified in FIGS. 6a and 6b.

Furthermore, although FIG. 7 depicts the radiation-emitting device 470 directly illuminating the at least one coating 460 and the sensor 425 directly receiving reflected radiation, in other embodiments falling within the scope of the disclosure one or more further optical elements may be disposed in a radiation path between the sensor 425 and/or the radiation-emitting device 470, and the portion of a backside surface 450 of an optical element 405. For example, one or more focusing lenses may be disposed in such a radiation path. In other examples, one or more radiation guides, such as optical fibers, may transfer radiation between a cavity in which the portion of a backside surface 450 resides and the sensor 425 and/or radiation-emitting device 470.

In yet further embodiments falling within the scope of the disclosure, the sensor 425 of the example of FIG. 7 may be arranged such that the sensor 425 does not physically contact the optical element 405. For example, in some embodiments, the sensor 425 may be supported by a support structure, such as a frame. The support structure may be a frame for holding the optical element 405. In such embodiments, the optical element 405 may be provided without one or more cavities to provide a portion of a backside surface 450 of the optical element 405 for sensing a temperature of. That is, the backside surface of the optical element 405 where the temperature is sensed may, in some embodiments, be substantially planar.

In yet a further embodiment, a/the at least one coating 460 may be additionally or alternatively formed the sensor 425.

Continuing with the example of FIG. 7, the sensor 425 is configured to sense radiation 455 emitted by the radiation-emitting device 470 and reflected from the at least one coating 460 and/or from the backside surface 450 of the optical element. In some embodiments, the sensor 425 may comprise a camera, e.g. a device for sensing optical radiation. In other embodiments sensor 425 may comprise one or more spectral sensors. In yet further embodiments, the sensor 425 may comprise one or more photosensitive device such as photodiodes.

For example, the at least one coating 460 may be selected and/or configured to exhibit transmission and/or absorption and/or reflectivity characteristics that are temperature-dependent. In yet further example embodiments, the at least one coating 460 may be selected and/or configured to alter a wavelength and/or phase of incident radiation. For example, in some embodiments the at least one coating 460 may comprise a plurality of coatings configured as an interference filter and/or a grating, such as a volume Bragg grating, having temperature-dependent optical properties.

The optical apparatus may comprise a temperature controller 480 configured to use a signal from the sensor 425 to control a temperature of the optical element 405. Such a temperature controller 480 may be part of a MPHS as described above. That is, based on the signal from the sensor 425 the temperature controller 480 may be configured to adapt an intensity or dosage of infrared radiation emitted from the MPHS towards the optical element 405 to balance an EUV radiation induced heat load and thereby maintain the temperature of the optical element 405 substantially at or close to a nominal temperature.

Although FIG. 7 depicts only a single sensor 425, it will be appreciated that in embodiments corresponding to FIGS. 6a, 6b and 7, a plurality of sensors may be implemented. In such embodiments, the backside surface 350, 450 of the optical element 305, 405 may comprise a plurality of cavities, each cavity having an associated sensor 325, 425 configured to sense radiation 355, 455 corresponding to a temperature of a portion of the backside surface 350, 450 of the optical element 305, 405 within the cavity.

Furthermore, although FIG. 7 depicts the radiation 475 emitted by the radiation-emitting device 470 and the reflected radiation 455 on separate paths, in other embodiments falling within the scope of the disclosure, radiation 475 and radiation 455 may travel on a common path. In some examples, a radiation guide, such as an optical fiber, may provide radiation 455 and collect reflected radiation 455. In some embodiments, radiation 475 emitted by the radiation-emitting device 470 may be reflected back towards the radiation-emitting device 470, e.g. radiation 455 and radiation 475 may travel on a common path. In some embodiments an optical device, such as a beam splitter, may separate the reflected radiation at the radiation-emitting device 470. In some embodiments, the radiation-emitting device 470 may be configured to sense reflected radiation 455.

In example embodiments wherein the at least one coating 460 comprises a thermochromic coating, the coating may comprise a material such as vanadium di-oxide wherein, as a temperature changes, optical properties of the coating reversibly change.

Figure 8:
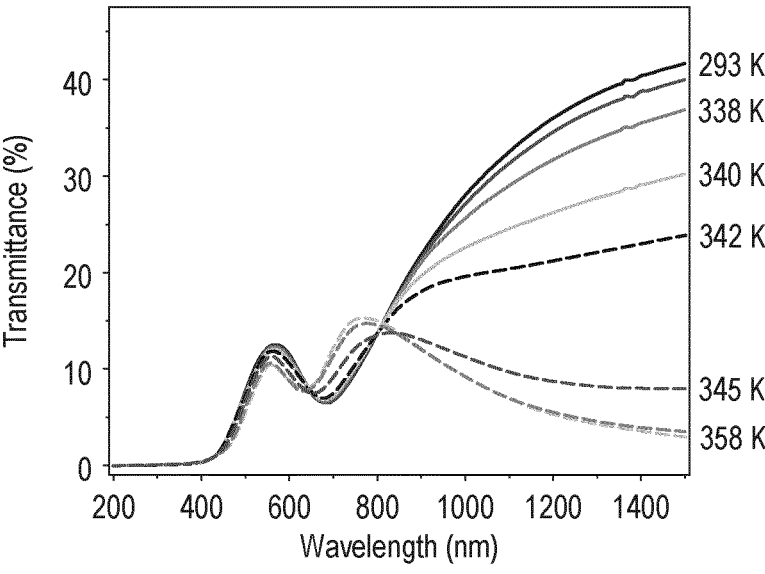
FIG. 8 is a graph depicting a relationship between transmittance and wavelength of radiation for a thermochromics coating, as implemented in embodiments of the disclosure.

This is further illustrated in FIG. 8, which depicts a graph showing a relationship between transmittance and wavelength of radiation for a vanadium di-oxide coating. It can be seen that at different temperatures the transmittance of radiation, particularly in a near-infrared range, may vary substantially. For example, at a temperature of 358 Kelvin, it can be seen that at a wavelength of approximately 1200 nanometers a transmittance is approximately 5%. In contrast, the transmittance is closer to 40% at a temperature of 293 Kelvin. That is, the transmittance of the coating 460, and hence an overall reflectively of the portion of the backside surface 450 having the coating 460, significantly varies with temperature.

It will be appreciated that a sensor 425 and radiation-emitting device 470 may be selected to operate at wavelengths of radiation 475, 455 that correspond to characteristics of a selected coating 460. For example, continuing with the example described with reference to FIG. 8, a sensor 425 configurable to sense near-infrared radiation may be selected and a radiation-emitting device 470 capable of emitting near-infrared radiation may be selected.

As described above, advantageously the disclosed optical apparatus of FIGS. 6a, 6b and 7 enable the portion of the backside surface 350, 450 of which the temperature is sensed to be disposed relatively close to the reflective surface 310, 410 or the optical element 305, 405. By having the sensed surface close to the reflective surface 310, 410, the time constant 'τ' may be minimized. This effect is depicted in FIG. 9, which is a graph depicting a simulated closed-loop response of temperature control of an optical element, wherein the sensed portion of the backside surface is at depths of 5 mm and 15 mm relative to a reflective surface of the optical element.

In this simulation, an EUV pupil is applied to the reflective surface of an optical element, and a temperature controller attempts to maintain an optical footprint (OFP) temperature at a control temperature.

Figure 9:
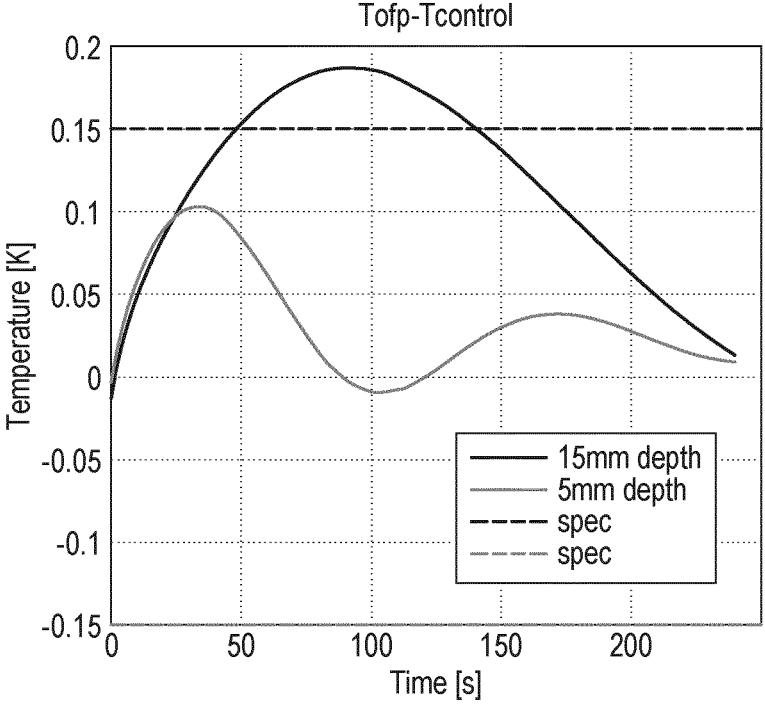
FIG. 9 is a graph depicting a closed-loop response of temperature control of an optical element.

Also depicted in FIG. 9 by dashed lines is a tolerance of +/−0.15 Kelvin, which may indicate an allowable variation in temperature.

It can be seen that at a depth of 15 millimeters, as is typical of an existing optical apparatus implemented in existing lithographic system, the controller takes a considerable time to stabilize the temperature, and only after more than 140 seconds is the temperature within the tolerance of +/−0.15 Kelvin. In a lithographic system configured to process wafers with a typical exposure time of approximately 20 seconds, this may lead to significant optical aberrations in the reflective surface of the optical element that may affect at least a first 8 wafers.

In contrast, at a depth of only 5 mm it is clear that the controller is able to maintain the temperature within the allowable tolerance, and stabilize the temperature, relatively quickly.

The above-described optical apparatus embodied in FIGS. 6a, 6b and 7 may be implemented at part of an optical system, wherein the optical system may be configured as a projection system PS for a lithographic apparatus LA and depicted in FIG. 1. Similarly, such an optical apparatus may be implemented at part of an optical system, wherein the optical system may be configured as an illumination system IL for a lithographic apparatus LA and depicted in FIG. 1.

Figure 10:
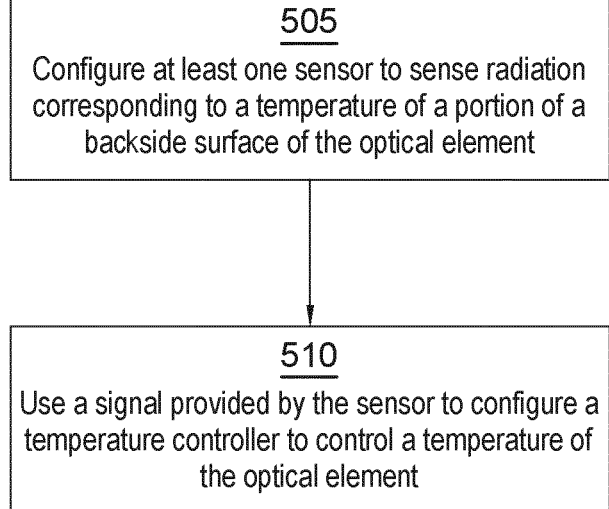
FIG. 10 depicts a method of controlling a temperature of a reflective surface of an optical element in a lithographic apparatus.

FIG. 10 depicts a method of controlling a temperature of a reflective surface of an optical element in a lithographic apparatus.

In a first step 505 at least one sensor 325, 425 is configured to sense radiation 355, 455 corresponding to a temperature of a portion of a backside surface 350, 450 of the optical element 305, 405.

In a second step 510, a signal provided by the sensor 325, 425 is used to configure a temperature controller, e.g. a MPHS, to control a temperature of the optical element 305, 405.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An optical apparatus comprising:
an optical element having a reflective surface for reflecting incident radiation in a beam path;
at least one sensor configured to sense radiation corresponding to a temperature of a respective portion of a backside surface of the optical element; and
at least one coating formed on the respective portion of the backside surface, the at least one coating configured to have temperature-dependent optical properties.

2. The optical apparatus of claim 1, wherein a gap is provided between the at least one sensor and the respective portion of the backside surface of the optical element.

3. The optical apparatus of claim 1, wherein the portion of the backside surface is in a cavity formed in a backside of the optical element.

4. The optical apparatus of claim 3, comprising at least one through-passage connecting a void defined by the gap to an area outside the cavity.

5. The optical apparatus of claim 3, wherein the cavity is formed such that the portion of the backside surface is less than 5 millimeters from the reflective surface.

6. The optical apparatus of claim 1, wherein the at least one sensor comprises a pyrometer configured to sense infrared radiation radiated from the respective portion of the backside surface of the optical element.

7. The optical apparatus of claim 6, comprising a high-emissivity coating formed on the portion of the backside surface.

8. The optical apparatus of claim 1, wherein the at least one coating comprises a thermochromic coating.

9. The optical apparatus of claim 1, wherein the at least one coating comprises a plurality of coatings configured as an interference filter and/or a grating having temperature-dependent optical properties.

10. The optical apparatus of claim 1, comprising at least one radiation-emitting device configured to emit radiation toward the at least one coating.

11. The optical apparatus of claim 10, wherein the at least one sensor is configured to sense radiation emitted by the radiation-emitting device and reflected from the at least one coating and/or from the backside surface of the optical element.

12. The optical apparatus of claim 1, comprising a temperature controller configured to use a signal from the at least one sensor to control a temperature of the optical element.

13. The optical apparatus of claim 1, comprising a plurality of sensors, wherein the backside surface of the optical element comprises a plurality of cavities, each cavity having an associated sensor configured to sense radiation corresponding to a temperature of a portion of the backside surface of the optical element within the cavity.

14. An optical system comprising at least one optical apparatus of claim 1.

15. The optical system of claim 14, configured as a projection system for a lithographic apparatus.

16. The optical system of claim 14, configured as an illumination system for a lithographic apparatus.

17. A lithographic apparatus comprising the optical system of claim 14.

* * * * *